(12) United States Patent
Hong et al.

(10) Patent No.: US 9,392,698 B2
(45) Date of Patent: Jul. 12, 2016

(54) CHIP-EMBEDDED PRINTED CIRCUIT BOARD AND SEMICONDUCTOR PACKAGE USING THE PCB, AND MANUFACTURING METHOD OF THE PCB

(71) Applicant: SAMSUNG ELECTRO-MECHANICS CO., LTD., Suwon (KR)

(72) Inventors: Suk Chang Hong, Yeongi (KR); Jung Soo Byun, Anyang (KR); Sang Kab Park, Cheongju (KR); Kwang Seop Youm, Yeongi (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/103,145

(22) Filed: Dec. 11, 2013

(65) Prior Publication Data

US 2014/0159222 A1 Jun. 12, 2014

(30) Foreign Application Priority Data

Dec. 11, 2012 (KR) .......... 10-2012-0143615

(51) Int. Cl.
*H01L 23/02* (2006.01)
*H05K 1/18* (2006.01)
(Continued)

(52) U.S. Cl.
CPC ............ *H05K 1/186* (2013.01); *H01L 23/13* (2013.01); *H01L 23/36* (2013.01); *H01L 23/49827* (2013.01); *H01L 23/5389* (2013.01); *H01L 24/19* (2013.01); *H01L 24/24* (2013.01); *H01L 25/105* (2013.01); *H05K 1/0209* (2013.01); *H05K 1/185* (2013.01); *H05K 3/465* (2013.01); *H01L 23/49816* (2013.01); *H01L 24/73* (2013.01); *H01L 24/82* (2013.01); *H01L 2224/0401* (2013.01); *H01L 2224/04105* (2013.01); *H01L 2224/12105* (2013.01); *H01L 2224/24246* (2013.01); *H01L 2224/2919* (2013.01); *H01L 2224/32145* (2013.01); *H01L 2224/32225* (2013.01); *H01L 2224/32245* (2013.01); *H01L 2224/48227* (2013.01);
(Continued)

(58) Field of Classification Search
CPC ......... H01L 24/19; H01L 24/82; H01L 24/24; H01L 23/36; H01L 23/49827; H01L 23/5389
See application file for complete search history.

(56) References Cited

U.S. PATENT DOCUMENTS

2007/0246813 A1* 10/2007 Ong et al. .................. 257/686
2010/0087035 A1*  4/2010 Yoo et al. .................. 438/109
(Continued)

FOREIGN PATENT DOCUMENTS

KR    10-2011-0111232    10/2011

*Primary Examiner* — A. Sefer
(74) *Attorney, Agent, or Firm* — NSIP Law (57) ABSTRACT

A chip-embedded printed circuit board (PCB), a semiconductor package using the PCB, and a manufacturing method of the chip-embedded PCB. The semiconductor package using a chip-embedded printed circuit board (PCB) includes upper and lower semiconductor packages having a package on package (PoP) structure, wherein the lower semiconductor package includes a base substrate including predetermined circuit patterns formed therein; an electronic component electrically connected to the circuit pattern and embedded in the base substrate such that one surface thereof is exposed to an upper surface of the base substrate; and a heat dissipation member installed on an exposed surface of the electronic component to dissipate heat generated from the electronic component to the outside.

9 Claims, 10 Drawing Sheets

(51) Int. Cl.
*H01L 23/13* (2006.01)
*H01L 23/36* (2006.01)
*H01L 23/538* (2006.01)
*H01L 25/10* (2006.01)
*H01L 23/00* (2006.01)
*H05K 1/02* (2006.01)
*H05K 3/46* (2006.01)
*H01L 23/498* (2006.01)

(52) U.S. Cl.
CPC ............... *H01L2224/73265* (2013.01); *H01L 2224/73267* (2013.01); *H01L 2224/8203* (2013.01); *H01L 2224/92244* (2013.01); *H01L 2225/0651* (2013.01); *H01L 2225/06568* (2013.01); *H01L 2225/1035* (2013.01); *H01L 2225/1058* (2013.01); *H01L 2225/1094* (2013.01); *H01L 2924/12042* (2013.01); *H01L 2924/15311* (2013.01); *H01L 2924/15331* (2013.01); *H01L 2924/18162* (2013.01); *H05K 2203/1469* (2013.01); *Y10T 29/4913* (2015.01)

(56) References Cited

U.S. PATENT DOCUMENTS

| | | | |
|---|---|---|---|
| 2011/0024888 A1* | 2/2011 | Pagaila et al. | 257/686 |
| 2011/0215464 A1* | 9/2011 | Guzek et al. | 257/737 |
| 2011/0227209 A1* | 9/2011 | Yoon et al. | 257/686 |
| 2012/0018871 A1* | 1/2012 | Lee et al. | 257/698 |
| 2012/0299173 A1* | 11/2012 | Mohammed et al. | 257/686 |
| 2013/0093073 A1* | 4/2013 | Chen et al. | 257/686 |
| 2013/0147026 A1* | 6/2013 | Topacio et al. | 257/698 |
| 2013/0178016 A1* | 7/2013 | Yim et al. | 438/108 |
| 2014/0133105 A1* | 5/2014 | Yee et al. | 361/720 |

\* cited by examiner

FIG. 1

- PRIOR ART -

CHIP-EMBEDDED PRINTED CIRCUIT BOARD AND SEMICONDUCTOR PACKAGE USING THE PCB, AND MANUFACTURING METHOD OF THE PCB

CROSS REFERENCE(S) TO RELATED APPLICATIONS

This application claims the benefit under 35 U.S.C. Section 119 of Korean Patent Application Ser. No. 10-2012-0143615, entitled "Chip-Embedded Printed Circuit Board and Semiconductor Package Using the Same, and Manufacturing Method of The PCB" filed on Dec. 11, 2012, which is hereby incorporated by reference in its entirety into this application.

BACKGROUND OF THE INVENTION

1. Technical Field

The present invention relates to a chip-embedded printed circuit board (PCB), a semiconductor package using the PCB, and a manufacturing method of the PCB, and more particularly, to a chip-embedded PCB in which a heat dissipation unit is provided on a surface of a portion of the board corresponding to a chip embedded in the board to enhance a heat dissipation function, a semiconductor package using the PCB, and a manufacturing method of the chip-embedded PCB.

2. Description of the Related Art

As electronic products (e.g., portable phones, and the like) have become multi-functional, connectivity and communication frequencies have increased and a dual-core, a quadruple-core, or the like, is employed in a printed circuit board (PCB), requiring a solution to dissipate heat of an application processor (AP) package.

Figure 1:
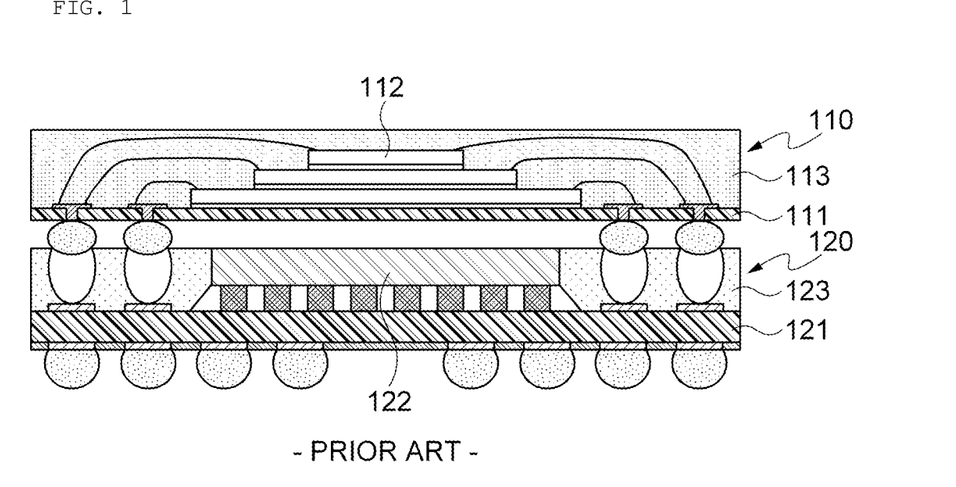
FIG. 1 is a view illustrating an example of a semiconductor package having a package on package (PoP) structure according to a related art.

FIG. 1 is a view illustrating an example of a semiconductor package having a package on package (PoP) structure according to a related art.

As illustrated in FIG. 1, the related art semiconductor package having a PoP structure may have a structure in which electronic components (e.g., AP chips, or the like) 112 and 122 are coated with molding materials 113 and 123, or the like. Also, the electronic components 112 and 122 may be buried with a resin within substrates 111 and 121.

Thus, heat generated from the electronic components 112 and 122 cannot be smoothly dissipated, causing malfunction or degrading the devices. In FIG. 1, reference numeral 110 denotes an upper semiconductor package and 120 denotes a lower semiconductor package, respectively.

RELATED ART DOCUMENT (Patent Document 1) Korean Patent Laid Open Publication No. 10-2011-0111232

SUMMARY OF THE INVENTION

An object of the present invention is to provide a chip-embedded printed circuit board (PCB) in which heat from a chip embedded in the board is effectively dissipated, a semiconductor package using the PCB, and a manufacturing method of the chip-embedded PCB.

According to an embodiment of the present invention, there is provided a chip-embedded printed circuit board (PCB) including: a base substrate including predetermined circuit patterns formed therein; an electronic component electrically connected to the circuit pattern and embedded in the base substrate such that one surface thereof is exposed to an upper surface of the base substrate; and a heat dissipation member installed on an exposed surface of the electronic component to dissipate heat generated from the electronic component to the outside.

The base substrate may further include a via structure formed therein and connecting the circuit patterns, and further include a ball pad formed on an upper surface thereof, connected to the via structure, and serving as an electrical connection for an additional printed circuit board or a semiconductor package.

The heat dissipation member may be made of a material having excellent heat conductivity and electrical conductivity.

As a material of the heat dissipation member, copper (Cu), aluminum (Al), or an alloy thereof may be used.

The heat dissipation member may be made of a metal (e.g., aluminum (Al)) having excellent heat dissipation properties, and the ball pad may be made of a metal (e.g., copper (Cu), gold (Au), platinum (Pt), or the like)) which is different from the metal of the heat dissipation member and has excellent electrical conductivity.

The heat dissipation member may be made of aluminum (Al) and the ball pad may be made of any one of metal among copper (Cu), gold (Au), and platinum (Pt).

The base substrate may further include a circuit protecting insulating material formed in a space between the circuit patterns exposed to the surface of the base substrate opposite a surface of the base substrate on which the heat dissipation member is installed.

A solder resist may be used as the circuit protecting insulating material.

According to another embodiment of the present invention, there is provided a semiconductor package using a chip-embedded printed circuit board (PCB), including: a lower semiconductor package positioned in a lower portion of a semiconductor package having a package on package (PoP) structure to serve as a base; and an upper semiconductor package stacked on the lower semiconductor package to constitute an overall single integrated semiconductor package having a PoP structure together with the lower semiconductor package, wherein the lower semiconductor package includes a base substrate including predetermined circuit patterns formed therein; an electronic component electrically connected to the circuit pattern and embedded in the base substrate such that one surface thereof is exposed to an upper surface of the base substrate; and a heat dissipation member installed on an exposed surface of the electronic component to dissipate heat generated from the electronic component to the outside.

The base substrate may further include a via structure formed therein and connecting the circuit patterns, and further include a ball pad formed on an upper surface thereof, connected to the via structure, and serving for an electrical connection with an additional printed circuit board or a semiconductor package.

The heat dissipation member may be made of a material having excellent heat conductivity and electrical conductivity.

As a material of the heat dissipation member, copper (Cu), aluminum (Al), or an alloy thereof may be used.

The heat dissipation member may be made of a metal (e.g., aluminum (Al)) having excellent heat dissipation properties, and the ball pad may be made of a metal (e.g., copper (Cu), gold (Au), platinum (Pt), or the like)) which is different from the metal of the heat dissipation member and has excellent electrical conductivity.

The heat dissipation member may be made of aluminum (Al) and the ball pad may be made of any one of metal among copper (Cu), gold (Au), and platinum (Pt).

The base substrate may further include a circuit protecting insulating material formed in a space between the circuit patterns exposed to the surface of the base substrate opposite a surface of the base substrate on which the heat dissipation member is installed.

A solder resist may be used as the circuit protecting insulating material.

According to another embodiment of the present invention, there is provided a method of manufacturing a chip-embedded printed circuit board (PCB), including: bonding an electronic component to one surface of a heat dissipation member; forming an insulating layer on one surface of the heat dissipation member such that the electronic component is buried; forming circuit patterns electrically connected to the electronic component within the insulating layer; and etching the heat dissipation member to form a heat dissipation pattern in contact with the electronic component.

The forming of the insulating layer and the forming of the circuit patterns may be performed a plurality of times.

The method may further include: forming a ball pad electrically connected to at least a portion of the circuit patterns on the insulating layer.

The ball pad may be formed simultaneously when the heat dissipation pattern is formed.

According to another embodiment of the present invention, there is provided a method of manufacturing a chip-embedded printed circuit board (PCB), including: preparing a base substrate with predetermined circuit patterns formed therein; partially removing an upper portion of the base substrate to form a cavity allowing a portion of the circuit patterns to be exposed therethrough; inserting an electronic component into the cavity such that the electronic component is electrically connected to the circuit patterns; forming a heat dissipation member on an upper surface of the base substrate and on an exposed surface of the electronic component; and etching the heat dissipation member to form a heat dissipation pattern on the exposed surface of the electronic component.

The method may further include: forming a ball pad electrically connected to at least a portion of the circuit patterns on the base substrate.

The ball pad may be formed simultaneously when the heat dissipation pattern is formed.

DESCRIPTION OF THE PREFERRED EMBODIMENTS

Terms and words used in the present specification and claims are not to be construed as a general or dictionary meaning but are to be construed as meaning and concepts meeting the technical ideas of the present invention based on a principle that the inventors can appropriately define the concepts of terms in order to describe their own inventions in best mode.

Thorough the specification, unless explicitly described to the contrary, the word "comprise" and variations such as "comprises" or "comprising", will be understood to imply the inclusion of stated elements but not the exclusion of any other elements. In addition, the terms "-er", "-or", "module", and "unit" described in the specification mean units for processing at least one function and operation, and can be implemented by hardware components or software components and combinations thereof.

Exemplary embodiments of the present invention will now be described in detail with reference to the accompanying drawings.

Figure 2:
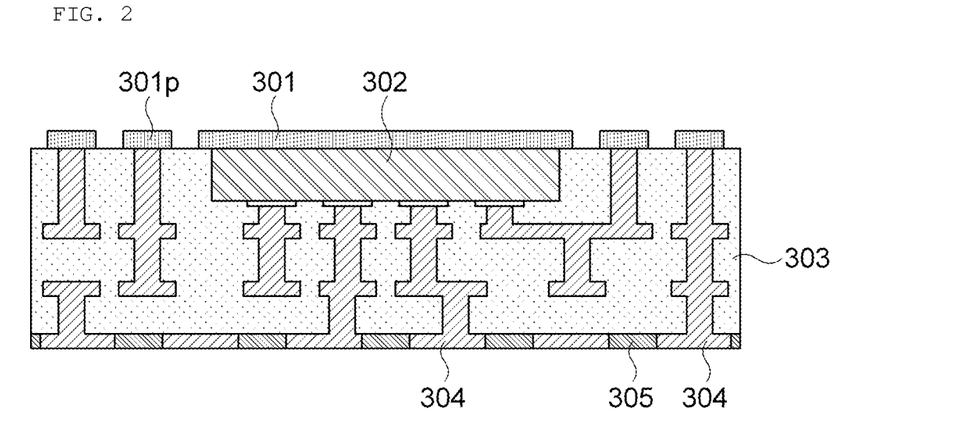
FIG. 2 is a view illustrating a structure of a chip-embedded printed circuit board (PCB) according to an embodiment of the present invention.

FIG. 2 is a view illustrating a structure of a chip-embedded printed circuit board (PCB) according to an embodiment of the present invention.

Referring to FIG. 2, a chip-embedded PCB according to an embodiment of the present invention includes a base substrate 303, an electronic component 302, and a heat dissipation member 301.

The base substrate 303 includes predetermined circuit patterns 304 therein. The base substrate 303 may have a single-layer structure or a multilayer structure.

The electronic component 302 may be electrically connected to the circuit pattern 304 and may be embedded in the base substrate 303 such that one surface thereof is exposed from an upper surface of the base substrate 303. Here, the electronic component 302 may be a semiconductor chip, an integrated circuit (IC) chip, or the like.

The heat dissipation member 301 may be installed on the exposed surface of the electronic component 302 and externally dissipates heat generated from the electronic component 302.

Here, the base substrate 303 may further include a via structure (which is integrally connected to the circuit pattern 304, so a reference numeral is not given) connecting the circuit patterns 304 and further include a ball pad 301p formed on an upper surface of the base substrate 303, connected to the via structure, and serving for electrical connection with an additional PCB or a semiconductor package.

Also, the heat dissipation member 301 may be made of a material having excellent heat conductivity and electrical conductivity.

Here, as a material of the heat dissipation member 301, copper (Cu), aluminum (Al), or an alloy thereof may be used.

Also, the heat dissipation member 301 may be made of a metal (e.g., aluminum (Al)) having excellent heat dissipation properties, and the ball pad 301p may be made of a metal (e.g., copper (Cu), gold (Au), platinum (Pt), or the like)) which is different from the metal of the heat dissipation member 301 and has excellent electrical conductivity.

Here, the heat dissipation member 301 may be made of aluminum (Al) and the ball pad 301p may be made of any one of metal among copper (Cu), gold (Au), and platinum (Pt).

Also, the base substrate 303 may further include a circuit protecting insulating material 305 formed in a space between the circuit patterns 304 exposed to the surface of the base substrate 303 opposite a surface of the base substrate 303 on which the heat dissipation member 301 is installed.

Here, a solder resist may be used as the circuit protecting insulating material 305.

Figure 3:
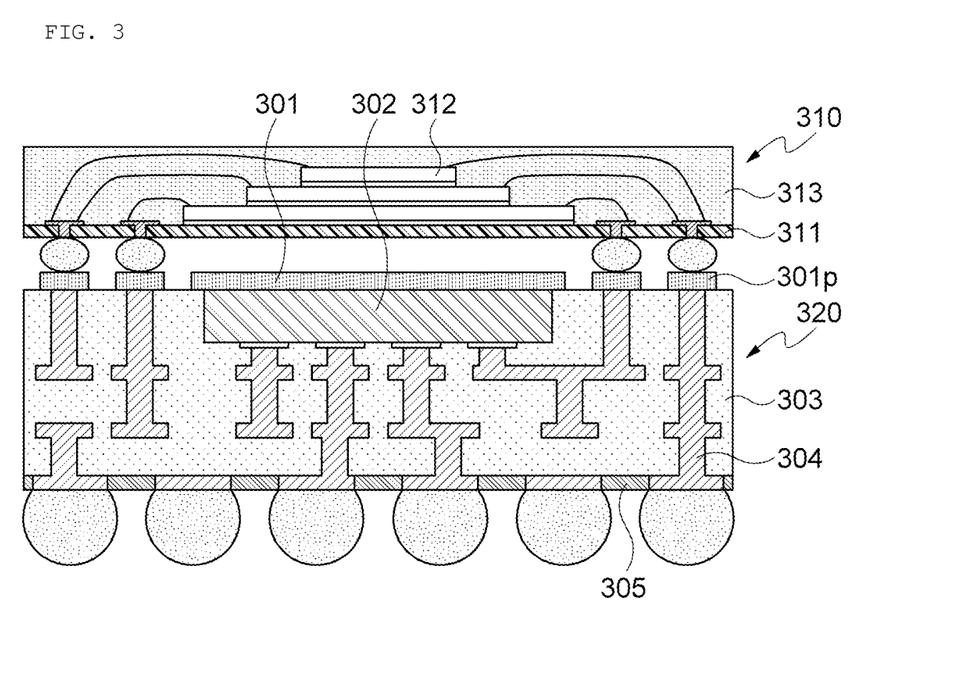
FIG. 3 is a view illustrating a structure of a semiconductor package using the chip-embedded PCB according to an embodiment of the present invention.

FIG. 3 is a view illustrating a structure of a semiconductor package using the chip-embedded PCB according to an embodiment of the present invention.

Referring to FIG. 3, a semiconductor package using a chip-embedded PCB according to an embodiment of the present invention includes a lower semiconductor package 320 and an upper semiconductor package 310.

The lower semiconductor package 320 is positioned in a lower portion of the semiconductor package having a package on package (PoP) structure to serve as a base.

The upper semiconductor package 310 is stacked on the lower semiconductor package 320 to constitute the overall integrated semiconductor package having a PoP structure together with the lower semiconductor package 320.

Here, the lower semiconductor package 320 includes a base substrate 303 including predetermined circuit patterns 304 formed therein, an electronic component 302 electrically connected to the circuit patterns 304 and embedded in the base substrate 303 such that one surface thereof is exposed to an upper surface of the base substrate 303, and a heat dissipation member 301 installed on the exposed surface of the electronic component 302 and externally dissipating heat generated from the electronic component 302.

Here, the base substrate 303 may further include a via structure (which is integrally connected to the circuit pattern 302, but a reference numeral is not given) connecting the circuit patterns 304 and further include a ball pad 301p formed on an upper surface of the base substrate 303, connected to the via structure, and serving as an electrical connection for an additional PCB or a semiconductor package.

Also, the heat dissipation member 301 may be made of a material having excellent heat conductivity and electrical conductivity.

Here, as a material of the heat dissipation member 301, copper (Cu), aluminum (Al), or an alloy thereof may be used.

Also, the heat dissipation member 301 may be made of a metal (e.g., aluminum (Al)) having excellent heat dissipation properties, and the ball pad 301p may be made of a metal (e.g., copper (Cu), gold (Au), platinum (Pt), or the like)) which is different from the metal of the heat dissipation member 301 and has excellent electrical conductivity.

Here, the heat dissipation member 301 may be made of aluminum (Al) and the ball pad 301p may be made of any one of metal among copper (Cu), gold (Au), and platinum (Pt).

Also, the base substrate 303 may further include a circuit protecting insulating material 305 formed in a space between the circuit patterns 304 exposed to the surface of the base substrate 303 opposite a surface of the base substrate 303 on which the heat dissipation member 301 is installed.

Here, a solder resist may be used as the circuit protecting insulating material 305.

In FIG. 3, reference numeral 311 denotes a substrate, reference numeral 312 denotes an electronic component, and reference numeral 313 denotes a molding member, respectively.

Hereinafter, a process of manufacturing a chip-embedded PCB according to an embodiment of the present invention will be described.

Figure 4:
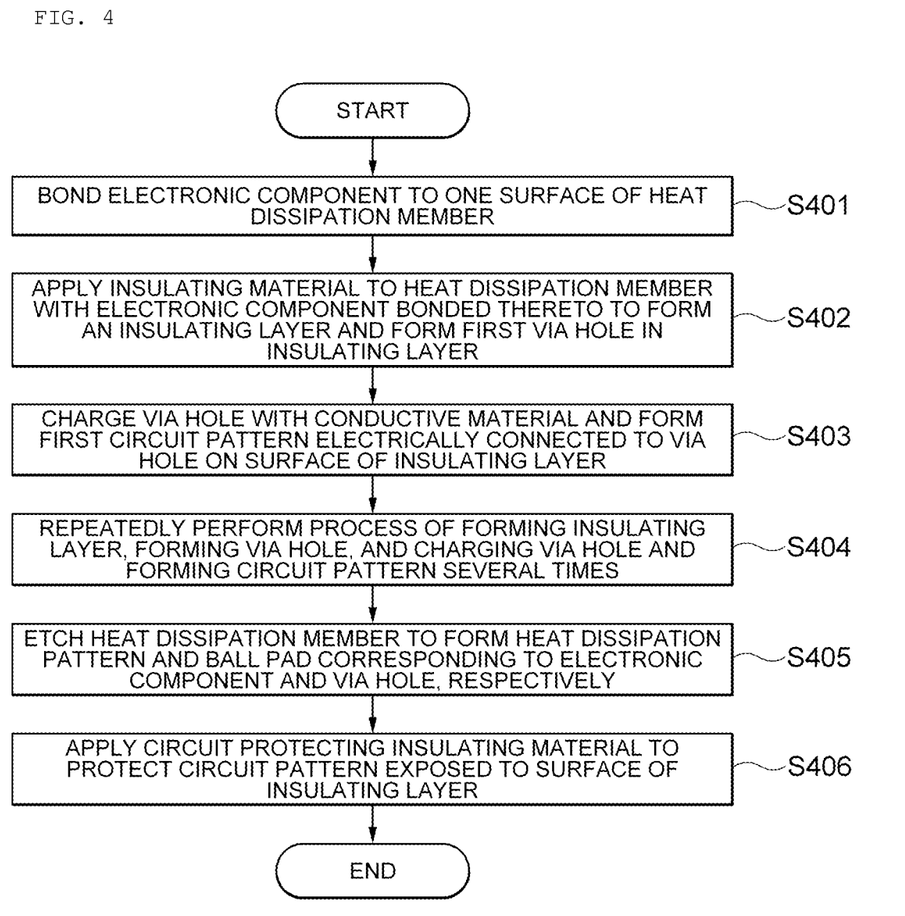
FIG. 4 is a flow chart illustrating a process of a method of manufacturing a chip-embedded PCB according to an embodiment of the present invention.

FIG. 4 is a flow chart illustrating a process of a method of manufacturing a chip-embedded PCB according to an embodiment of the present invention. FIGS. 5A through 5K are views sequentially illustrating a process of manufacturing a PCB according to a method of manufacturing a chip-embedded PCB according to an embodiment of the present invention.

Figure 5A:
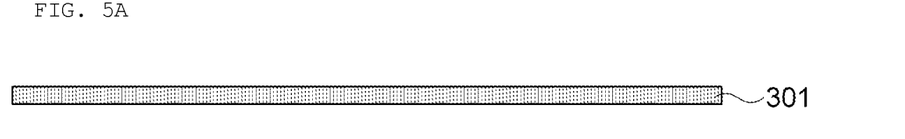
FIGS. 5A through 5K are views sequentially illustrating a process of manufacturing a PCB according to a method of manufacturing a chip-embedded PCB according to an embodiment of the present invention.
Figure 5B:
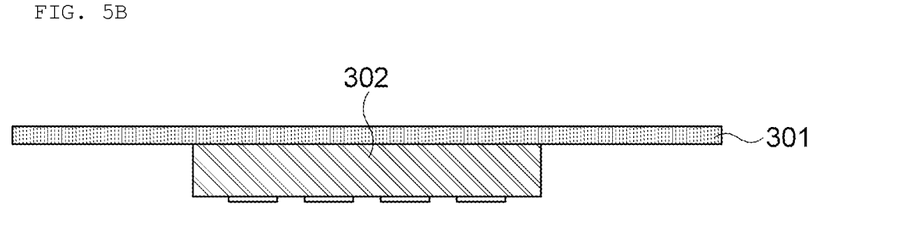

Referring to FIGS. 4 and 5A through 5K, according to the method of manufacturing a chip-embedded PCB according to an embodiment of the present invention, first, the electronic component 302 is bonded to one surface of the heat dissipation member 301 (step S401 and FIGS. 5A and 5B). Here, in order to bond the electronic component 302, an adhesive, a resin, or the like, may be used.

Figure 5C:
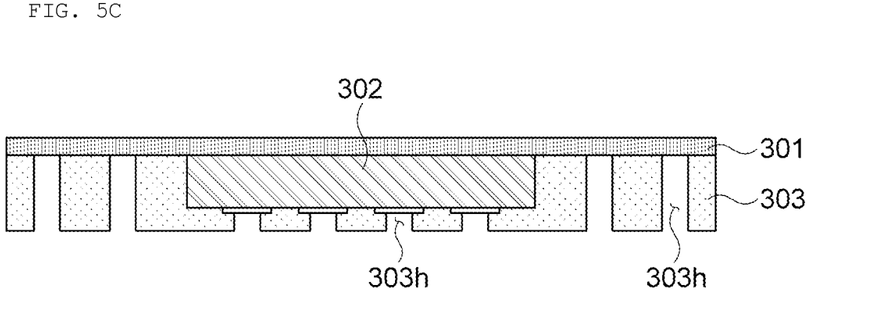

When bonding of the electronic component 302 is completed, an insulating material is first applied to the heat dissipation member 301 with the electronic component 302 bonded thereto to form an insulating layer 303 (here, the insulating layer in the manufacturing process forms a base substrate after the substrate is completely manufactured, so the insulating layer is denoted by the same reference numeral 303 as that of the base substrate) such that the electronic component 302 is buried, and thereafter, via holes 303h are formed in the insulating layer 303 such that the electronic component 302 and the heat dissipation member 301 are exposed therethrough (step S402, FIG. 5C).

Figure 5D:
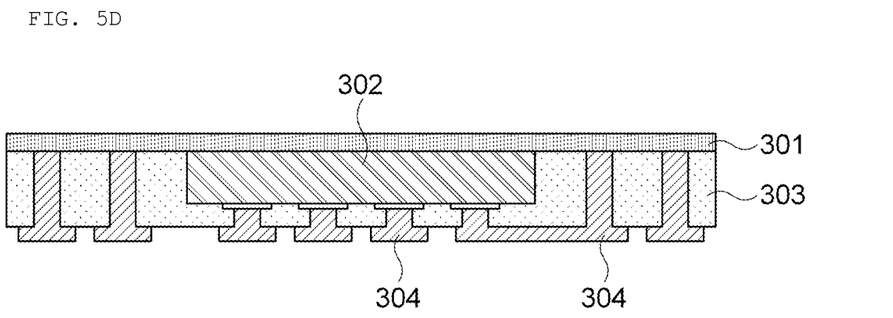

Thereafter, the via holes 303h are charged with a conductive material, and a first circuit pattern 304 electrically connected to the via holes 303h (i.e., electrically connected to the electronic component 302) is formed (step S403, FIG. 5D).

Thereafter, a process of forming the insulating layer 303, forming the via holes 303h, and charging the via holes and forming the circuit pattern 304 is repeatedly performed several times in a stacking manner (step S404, FIGS. 5E to 5j).

Figure 5E:
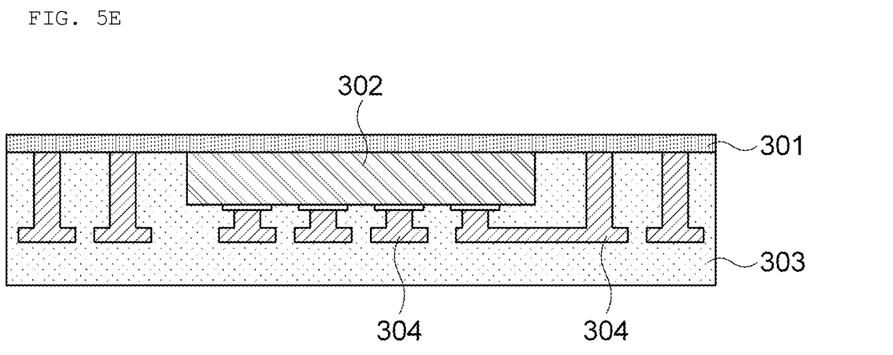
Figure 5F:
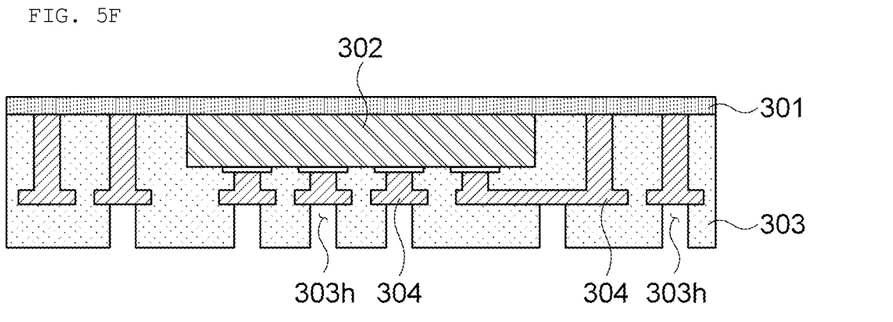

Namely, as illustrated in FIG. 5E, an insulating material is secondly applied to the insulating layer 303 with the first circuit pattern 304 formed thereon to form the insulating layer 303 in a stacked manner, and as illustrated in FIG. 5F, via holes 303h are formed in the insulating layer 303 (denoted by the same reference numeral because it is the same insulating layer) such that the first circuit pattern 304 is exposed therethrough.

Figure 5G:
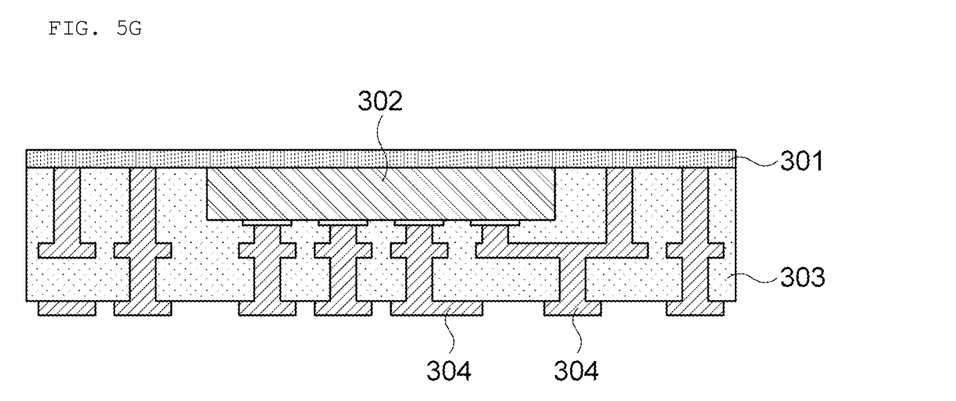

Thereafter, as illustrated in FIG. 5G, a conductive material is charged in the via holes 303h and a second circuit pattern 304 (denoted by the same reference numeral because it is connected as one circuit pattern with the first circuit pattern) is simultaneously formed.

Figure 5H:
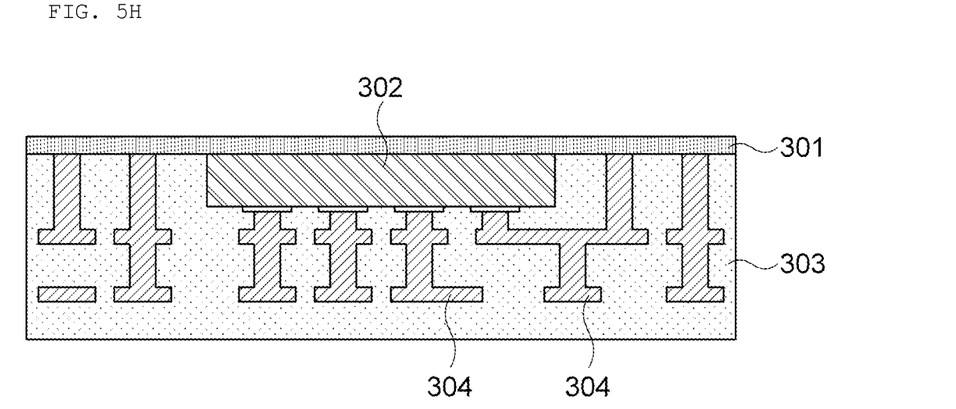
Figure 5I:
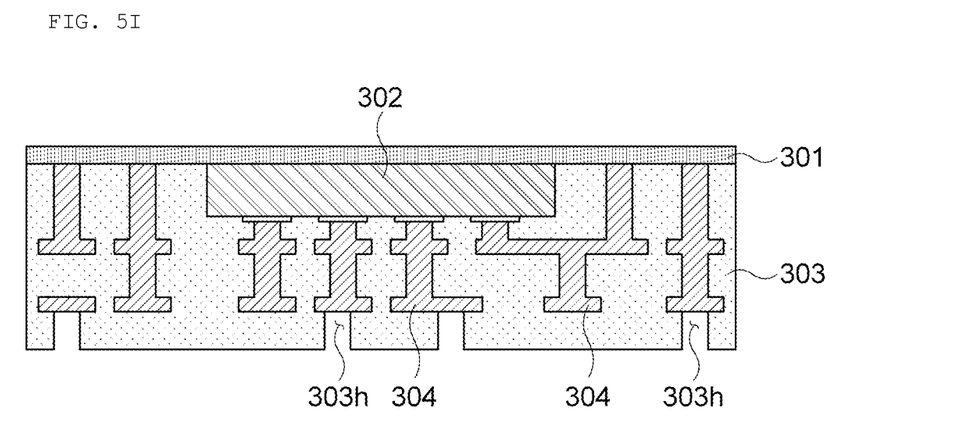

Thereafter, as illustrated in FIG. 5H, an insulating material is thirdly applied to the insulating layer 303 including the second circuit pattern 304 formed therein to form an insulating layer 303 in a stacked manner such that the second circuit pattern 304 is buried therein, and thereafter, as illustrated in FIG. 5I, via holes 303h are formed in the stacked insulating layer 303 such that the second circuit pattern 304 is exposed therethrough.

Figure 5J:
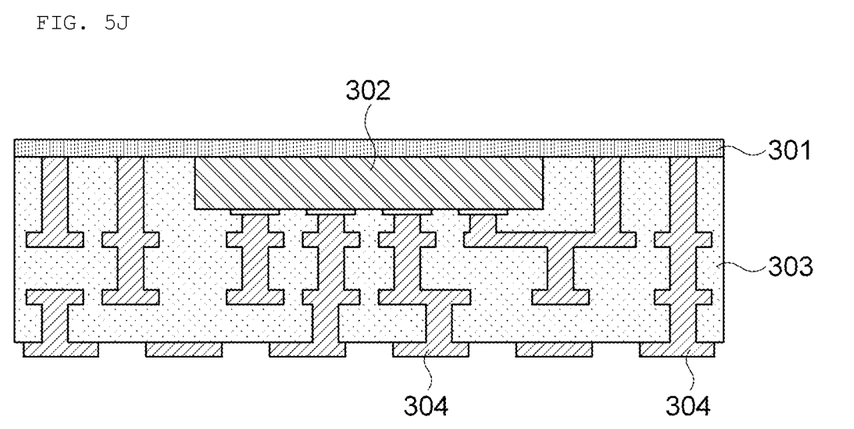

Thereafter, as illustrated in FIG. 5j, the via holes 303h are charged with a conductive material and a third circuit pattern 304 is simultaneously formed.

Here, the process of forming the insulating layer, forming the via holes, and charging the via holes and forming the circuit pattern is repeatedly performed a plurality of times according to the specification of the manufactured substrate, and in the present embodiment, it is assumed that the process is repeatedly performed three times for the sake of convenience.

Figure 5K:
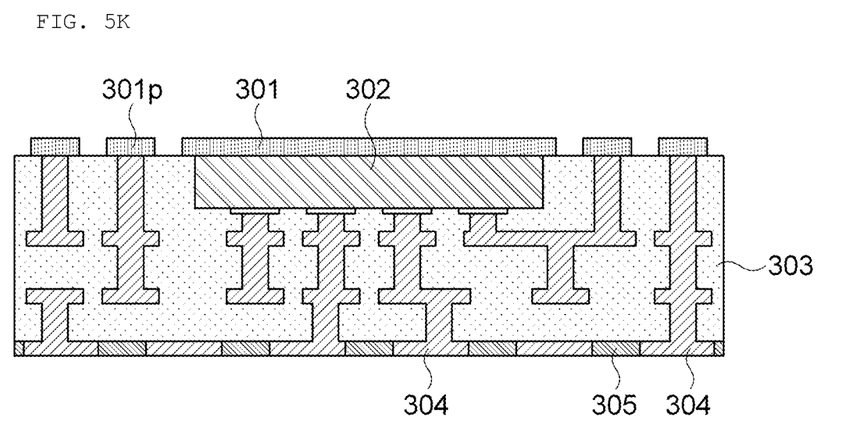

When the forming of the third circuit pattern 304 is completed, as illustrated in FIG. 5K, the heat dissipation member 301 is etched to form a heat dissipation pattern (i.e., a portion of the heat dissipation member 301 directly in contact with the electronic component 302) corresponding to the electronic component 302 and the via hole 303h and the ball pad 301p (step S405). Here, in case that the heat dissipation pattern and the ball pad 301p are made of the same material, they are simultaneously patterned, and in case that the heat dissipation pattern and the ball pad 301p are made of different materials, the ball pad 301p is separately patterned.

Here, preferably, the method may further include a step (S406) of applying a circuit protecting insulating material 305 to an exposed surface of the insulating layer 303 to protect the circuit pattern 304. Here, solder resist may be used as the circuit protecting insulating material 305.

Here, the process of applying the circuit protecting insulating material 305 and the process of forming the heat dissipation pattern and the ball pad 301p may be simultaneously performed, or the process of applying the circuit protecting insulating material 305 may be first performed.

Also, as an insulating material used to form the insulating layer 303, a thermosetting resin may be used.

Here, the thermosetting resin may include an epoxy resin, an amino resin, a phenol resin, an urea resin, a melamine resin, an unsaturated polyester resin, a polyurethane resin, a polyimide resin, or the like.

Also, in order to form the via holes 303h, dry etching may be used.

Here, an excimer laser or a processing method based on $CO_2$ laser may be used for dry etching.

Also, as the conductive material used to charge the via holes 303h and form the circuit pattern 304, gold (Au), aluminum (Al), copper (Cu), or the like, may be used.

Also, in order to charge the via holes 303h with a conductive material and form the circuit pattern 304, an electrolytic plating method and photolithography using a mask may be used.

Also, a material having excellent heat conductivity and electrical conductivity may be used to form the heat dissipation member 301.

Here, copper (Cu), aluminum (Al), or an alloy thereof may be used as a material of the heat dissipation member 301.

Also, the heat dissipation member 301 may be made of a metal (e.g., aluminum (Al)) having excellent heat dissipation properties, and the ball pad 301p may be made of a metal (e.g., copper (Cu), gold (Au), platinum (Pt), or the like) which is different from that of the heat dissipation member 301 and has excellent electrical conductivity.

In this case, the heat dissipation member 301 may be made of aluminum (Al), and the ball pad 301p may be made of any one of metals among copper (Cu), gold (Au), and platinum (Pt).

Figure 6:
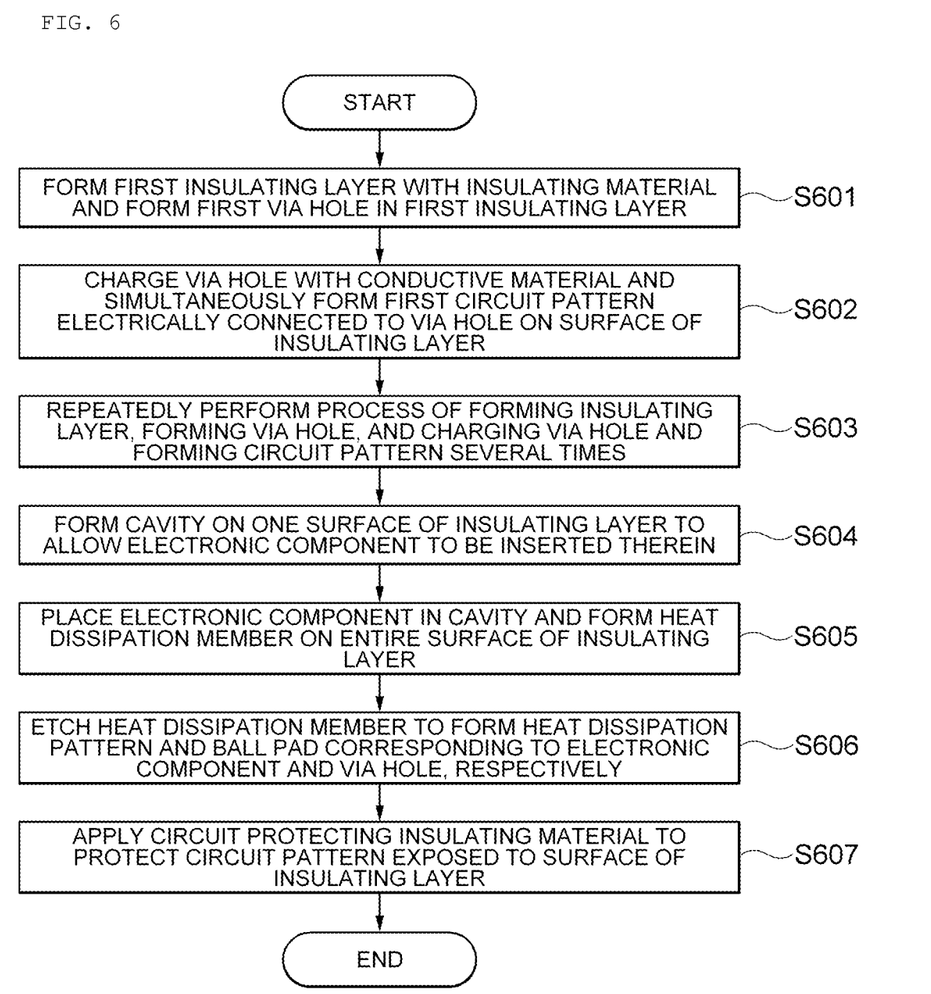
FIG. 6 is a flow chart illustrating a process of a method of manufacturing a chip-embedded PCB according to another embodiment of the present invention.

FIG. 6 is a flow chart illustrating a process of a method of manufacturing a chip-embedded PCB according to another embodiment of the present invention. FIGS. 7A through 7K are views sequentially illustrating a process of manufacturing a PCB according to a method of manufacturing a chip-embedded PCB according to another embodiment of the present invention.

Referring to FIG. 6, according to the method of manufacturing a chip-embedded PCB according to another embodiment of the present invention, first, a base substrate 303 (which corresponds to the insulating layer 303 in the process of manufacturing the substrate, and is, thus, denoted by the same reference numeral 303 as that of the insulating layer 303) with a predetermined circuit pattern 304 formed therein is prepared. Here, a process of preparing the base substrate 303 with the predetermined circuit pattern formed therein will be described in detail with reference to FIGS. 7A through 7H.

Figure 7A:
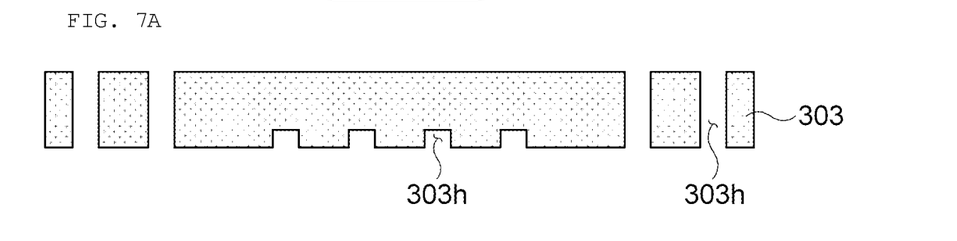
FIGS. 7A through 7K are views sequentially illustrating a process of manufacturing a PCB according to a method of manufacturing a chip-embedded PCB according to another embodiment of the present invention.

First, a first insulating layer 303 is formed with a predetermined insulating material, and first via holes 303h are formed within the first insulating layer 303 (step S601).

Figure 7B:
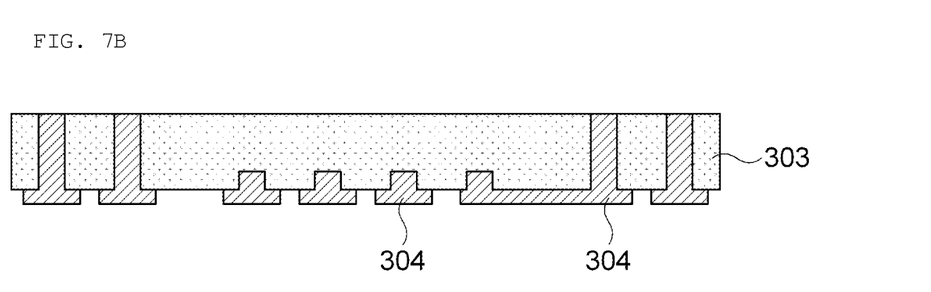

Next, as illustrated in FIG. 7B, the via holes 303h are charged with a conductive material and a first circuit pattern 304 electrically connected to the via holes is simultaneously formed on the surface of the insulating layer 303 (step S602).

Thereafter, a process of forming the insulating layer 303, forming the via holes 303h, and charging the via holes and forming the circuit pattern 304 is repeatedly performed several times in a stacking manner (step S603, FIGS. 7C to 7H).

Figure 7C:
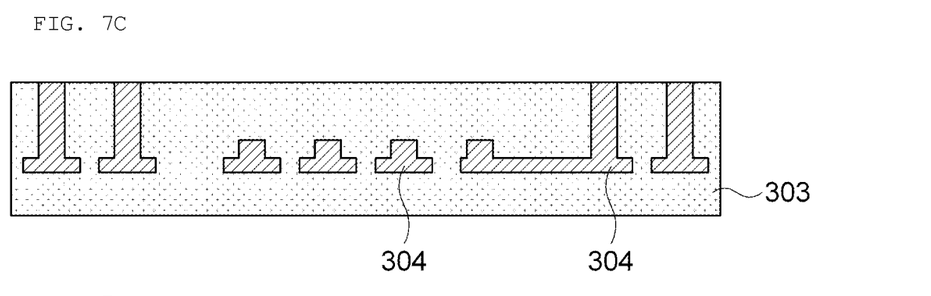
Figure 7D:
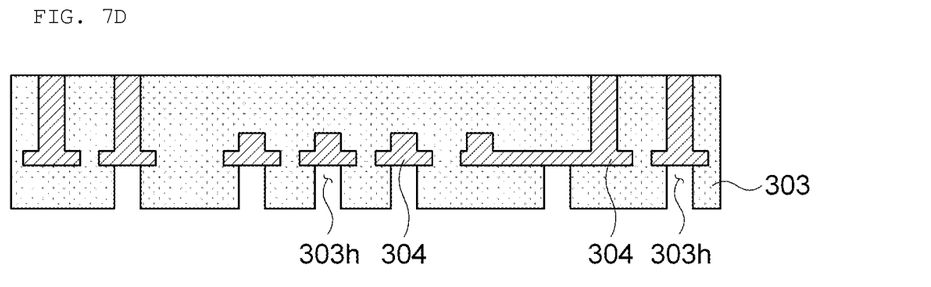

Namely, as illustrated in FIG. 7C, an insulating material is secondly applied to the insulating layer 303 with the first circuit pattern 304 formed thereon to form the insulating layer 303 in a stacked manner, and as illustrated in FIG. 7D, via holes 303h are formed in the insulating layer 303 (denoted by the same reference numeral because it is the same insulating layer) such that the first circuit pattern 304 is exposed therethrough.

Figure 7E:
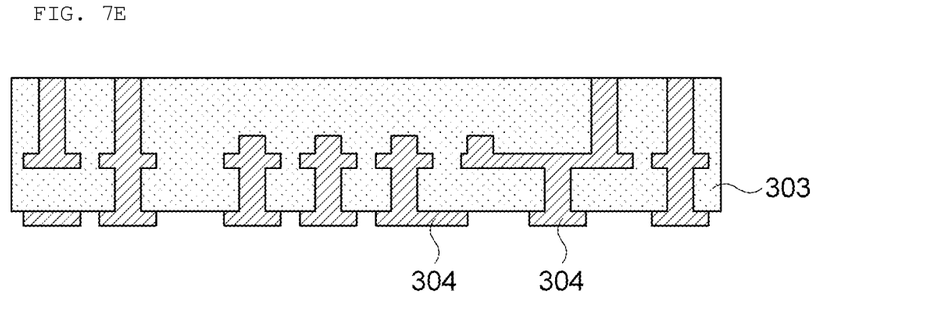

Thereafter, as illustrated in FIG. 7E, a conductive material is charged in the via holes 303h and a second circuit pattern 304 (denoted by the same reference numeral because it is connected as one circuit pattern with the first circuit pattern) is simultaneously formed.

Figure 7F:
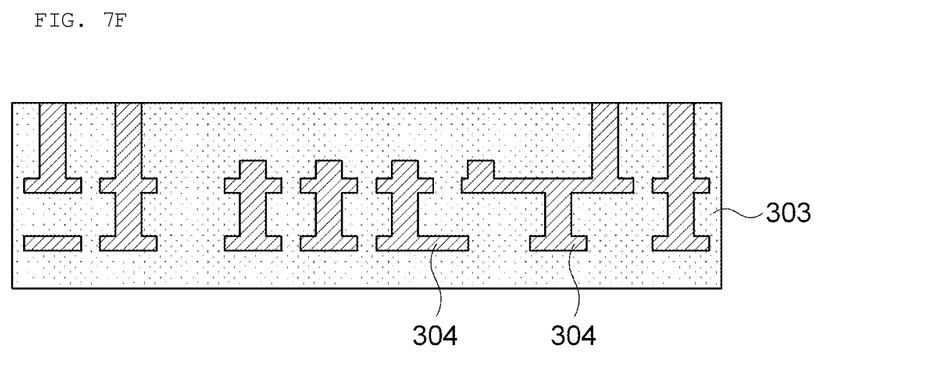
Figure 7G:
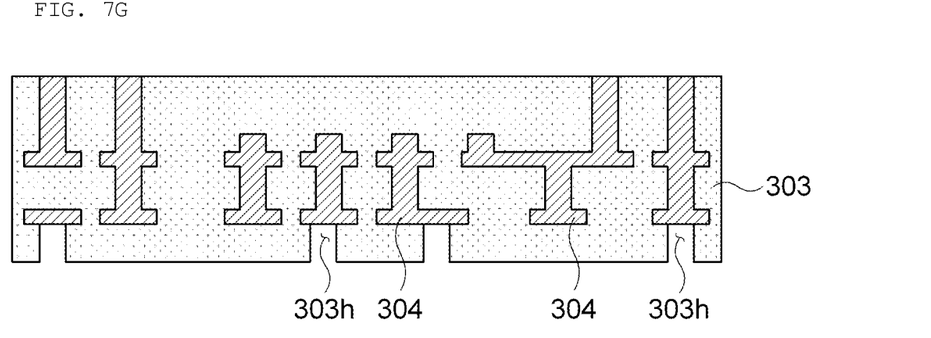

Thereafter, as illustrated in FIG. 7F, an insulating material is thirdly applied to the insulating layer 303 including the second circuit pattern 304 formed therein to form an insulating layer 303 in a stacked manner such that the second circuit pattern 304 is buried therein, and thereafter, as illustrated in FIG. 7G, via holes 303h are formed in the stacked insulating layer 303 such that the second circuit pattern 304 is exposed therethrough.

Figure 7H:
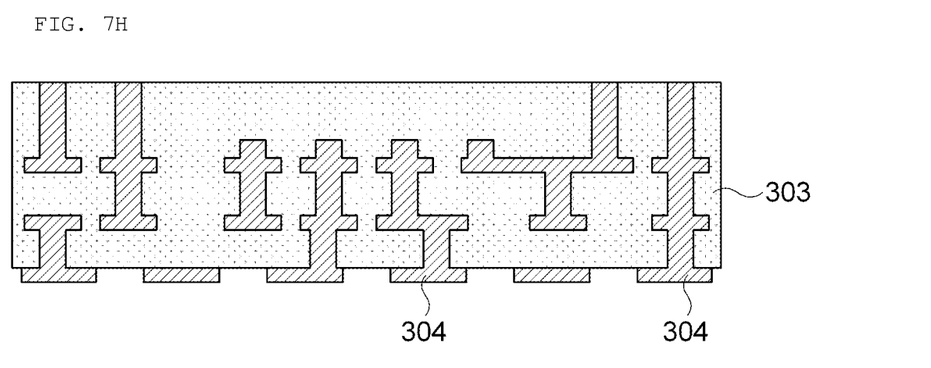

Thereafter, as illustrated in FIG. 7H, the via holes 303h are charged with a conductive material and a third circuit pattern 304 is simultaneously formed.

Here, like the case (FIGS. 5A through 5K) as described above, the process of forming the insulating layer, forming the via holes, and charging the via holes and forming the circuit pattern is repeatedly performed a plurality of times according to the specification of the manufactured substrate, and in the present embodiment, it is assumed that the process is repeatedly performed three times for the sake of convenience.

Figure 7I:
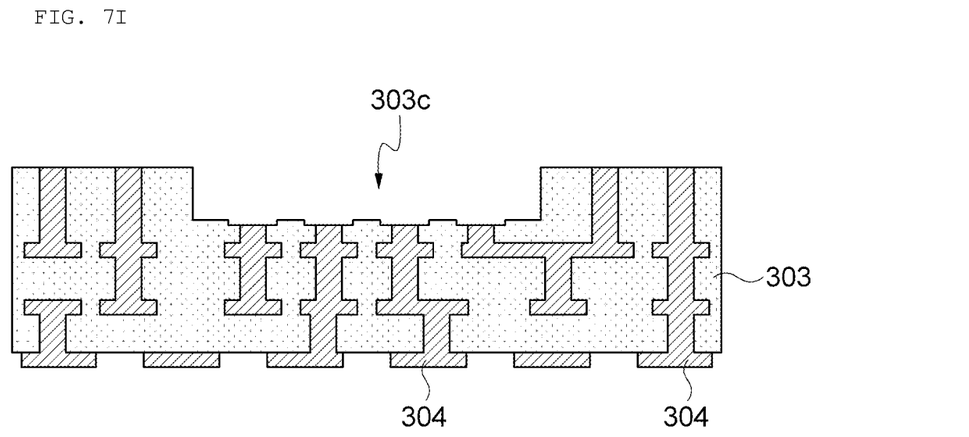

When the forming of the third circuit pattern 304 is completed, an upper portion of the base substrate 303 is partially removed to form a cavity exposing a portion of the circuit pattern 304. Namely, as illustrated in FIG. 7I, a cavity 303h having a predetermined size is formed in one surface of the insulating layer 303 to allow an electronic component to be inserted therein (step S604).

Figure 7J:
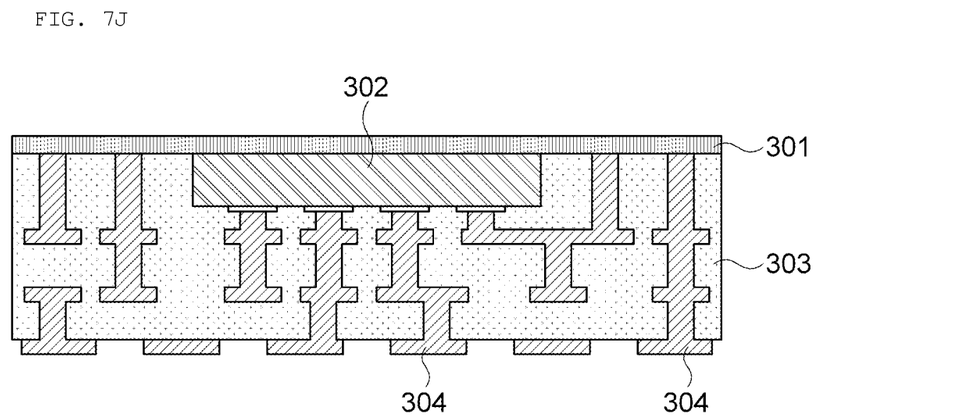

Thereafter, as illustrated in FIG. 7J, the electronic component 302 is placed in the cavity 303h such that the electronic component is electrically connected to the circuit pattern 304, and thereafter, the heat dissipation member 301 is formed on the entire surface of the insulating layer 303 (i.e., on the upper surface of the base substrate 303 and the exposed surface of the electronic component 302) (step S605).

Figure 7K:
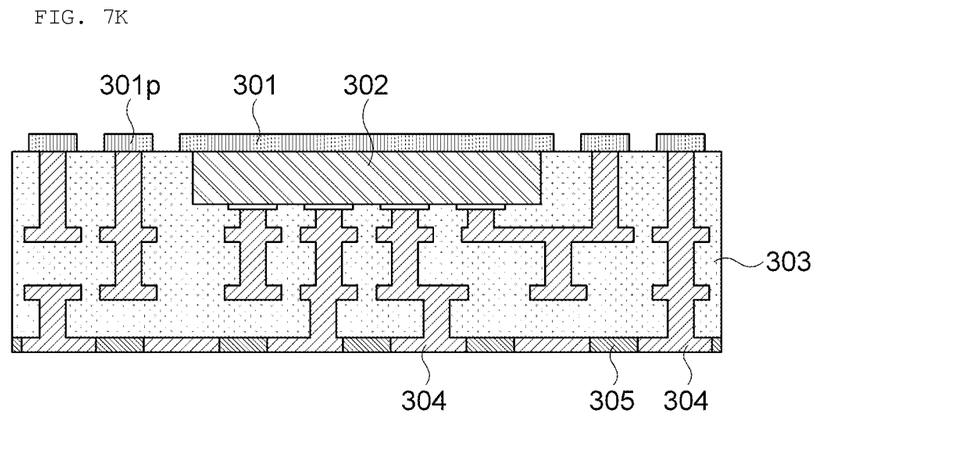

Thereafter, as illustrated in FIG. 7K, the heat dissipation member 301 is etched to form a heat dissipation pattern (i.e., a portion of the heat dissipation member 301 directly in contact with the electronic component 302) corresponding to the electronic component 302 and the via hole 303h and the ball pad 301p (step S606). Here, in case that the heat dissipation pattern and the ball pad 301p are made of the same material, they are simultaneously patterned, and in case that the heat dissipation pattern and the ball pad 301p are made of the different materials, the ball pad 301p is separately patterned.

Here, preferably, the method may further include a step (S607) of applying a circuit protecting insulating material 305 to an exposed surface of the insulating layer 303 to protect the circuit pattern 304.

Here, solder resist may be used as the circuit protecting insulating material 305.

Also, as an insulating material used to form the insulating layer 303, a thermosetting resin may be used.

Here, the thermosetting resin may include an epoxy resin, an amino resin, a phenol resin, a urea resin, a melamine resin, an unsaturated polyester resin, a polyurethane resin, a polyimide resin, or the like.

Also, in order to form the via holes 303h, dry etching may be used.

Here, an excimer laser or a processing method based on $CO_2$ laser may be used for dry etching.

Also, as the conductive material used to charge the via holes 303h and form the circuit pattern 304, gold (Au), aluminum (Al), copper (Cu), or the like, may be used.

Also, in order to charge the via holes 303h with a conductive material and form the circuit pattern 304, an electrolytic plating method and photolithography using a mask may be used.

Also, a material having excellent heat conductivity and electrical conductivity may be used to form the heat dissipation member 301.

Here, copper (Cu), aluminum (Al), or an alloy thereof may be used as a material of the heat dissipation member 301.

Also, the heat dissipation member 302 may be made of a metal (e.g., aluminum (Al)) having excellent heat dissipation properties, and the ball pad 301p may be made of a metal (e.g., copper (Cu), gold (Au), platinum (Pt), or the like) which is different from that of the heat dissipation member 301 and has excellent electrical conductivity.

In this case, the heat dissipation member 301 may be made of aluminum (Al), and the ball pad 301p may be made of any one of metals among copper (Cu), gold (Au), and platinum (Pt).

According to the embodiments of the present invention, in the case of the printed circuit board (PCB) and the semiconductor package, since an electronic component is embedded in the PCB such that one surface thereof is exposed to the outside of the PCB, and the heat dissipation member is installed to be directly in contact with the exposed portion of the embedded electronic component, thus effectively dissipating heat generated from the electronic component to the outside.

Also, since the semiconductor-embedded PCB having the foregoing structure is used as a lower package and an upper package is stacked thereon to form an overall integrated single semiconductor package, a semiconductor package product having excellent heat dissipation function can be manufactured, increasing reliability of the product.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions, and substitutions should also be understood to fall within the scope of the present invention.

What is claimed is:

1. A semiconductor package using a chip-embedded printed circuit board (PCB), the semiconductor package comprising:
a lower semiconductor package; and
an upper semiconductor package stacked on the lower semiconductor package,
wherein the lower semiconductor package comprises:
a base substrate comprising circuit patterns formed therein;
an electronic component electrically connected to the circuit patterns and embedded in the base substrate such that only one surface of the electronic component is exposed to an upper surface of the base substrate and the one surface is substantially entirely exposed to the upper surface of the base substrate; and
a heat dissipation member directly in contact with substantially a whole of the exposed surface of the electronic component to dissipate heat generated from the electronic component to the outside,
wherein the heat dissipation member is exposed to a gap between the upper semiconductor package and the lower semiconductor package.

2. The semiconductor package according to claim 1, wherein the base substrate further comprises a via structure formed therein and connecting the circuit patterns, and further comprises a ball pad formed on the upper surface of the base substrate, connected to the via structure, and forming an electrical connection for an additional printed circuit board or an additional semiconductor package.

3. The semiconductor package according to claim 2, wherein the heat dissipation member comprises a heat-dissipating metal, and the ball pad comprises a metal which is different from the metal of the heat dissipation member.

4. The semiconductor package according to claim 3, wherein the heat dissipation member comprises aluminum (Al), and the ball pad comprises any one of metal among copper (Cu), gold (Au), and platinum (Pt).

5. The semiconductor package according to claim 1, wherein the heat dissipation member comprises a material having heat conductivity and electrical conductivity.

6. The semiconductor package according to claim 5, wherein the heat dissipation member comprises copper (Cu), aluminum (Al), or an alloy thereof.

7. The semiconductor package according to claim 1, wherein the base substrate further comprises a circuit protecting insulating material formed in a space between the circuit patterns exposed to a surface of the base substrate opposite a surface of the base substrate on which the heat dissipation member is installed.

8. The semiconductor package according to claim 7, wherein the circuit protecting insulating material comprises solder resist.

9. A semiconductor package using a chip-embedded printed circuit board (PCB), the semiconductor package comprising:
a lower semiconductor package positioned in a lower portion of a semiconductor package having a package on package (PoP) structure to form a base; and
an upper semiconductor package stacked on the lower semiconductor package to constitute an overall single integrated semiconductor package having a PoP structure together with the lower semiconductor package,
wherein the lower semiconductor package comprises:
a base substrate comprising circuit patterns formed therein;

an electronic component electrically connected to the circuit patterns and embedded in the base substrate such that only one surface of the electronic component is exposed to an upper surface of the base substrate and the one surface is substantially entirely exposed to the upper surface of the base substrate;

a heat dissipation member directly in contact with substantially a whole of the exposed surface of the electronic component to dissipate heat generated from the electronic component to the outside; and the base substrate further comprises a ball pad formed on the upper surface of the base substrate on a same layer as the heat dissipation member, connected to a via structure, and the ball pad forming an electrical connection for an additional printed circuit board or an additional semiconductor package.

* * * * *